United States Patent
Bhavnagarwala et al.

(10) Patent No.: US 6,529,400 B1
(45) Date of Patent: Mar. 4, 2003

(54) SOURCE PULSED, DYNAMIC THRESHOLD COMPLEMENTARY METAL OXIDE SEMICONDUCTOR STATIC RAM CELLS

(75) Inventors: Azeez J. Bhavnagarwala, Atlanta, GA (US); Ashok K. Kapoor, Palo Alto, CA (US)

(73) Assignee: LSI Logic Corporation, Milpitas, CA (US)

(*) Notice: Subject to any disclaimer, the term of this patent is extended or adjusted under 35 U.S.C. 154(b) by 180 days.

(21) Appl. No.: 09/737,837

(22) Filed: Dec. 15, 2000

(Under 37 CFR 1.47)

(51) Int. Cl.[7] ............................................. G11C 11/00
(52) U.S. Cl. ........................ 365/154; 365/156; 365/190
(58) Field of Search ................................ 365/154, 156, 365/190

(56) References Cited

U.S. PATENT DOCUMENTS

| | | | |
|---|---|---|---|
| 5,303,190 A | * 4/1994 | Pelley, III | 327/509 |
| 5,631,863 A | * 5/1997 | Fechner et al. | 257/903 |
| 5,668,770 A | * 9/1997 | Itoh et al. | 257/903 |
| 5,898,610 A | * 4/1999 | Greason | 365/154 |
| 6,215,716 B1 | * 4/2001 | Itoh et al. | 365/154 |

* cited by examiner

Primary Examiner—Richard Elms
Assistant Examiner—Hien Nguyen
(74) Attorney, Agent, or Firm—Fitch, Even, Tabin & Flannery

(57) ABSTRACT

A source pulsed, dynamic threshold complementary metal oxide semiconductor static random access memory dynamically controls cell transistor threshold voltage to increase cell stability, decrease cell standby power, and reduce cell delay. A memory cell includes a low storage node and a high storage node wherein the low storage node is driven below Vss during a read access and the high storage node is driven above Vdd during the read access.

12 Claims, 7 Drawing Sheets

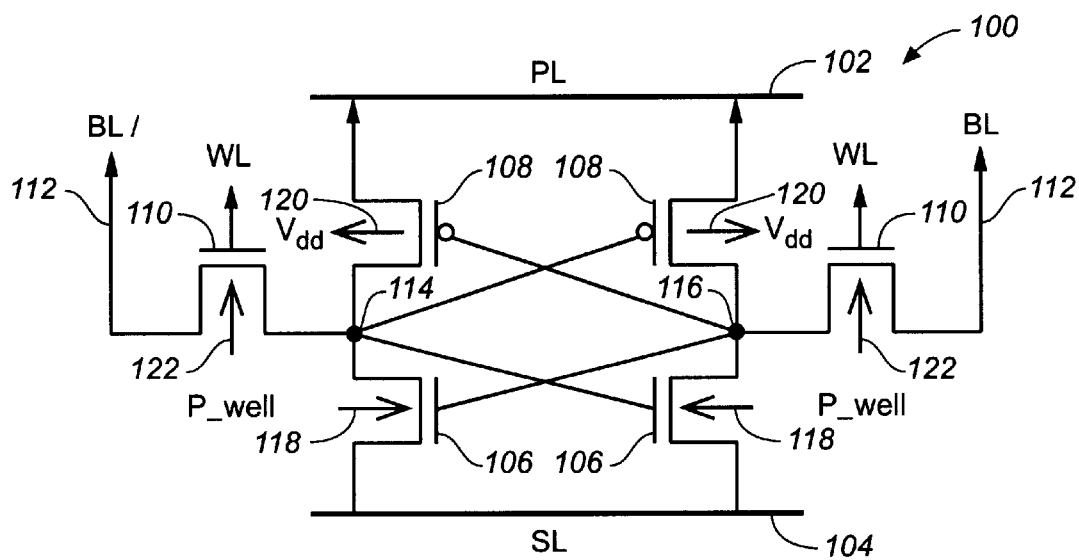
FIG._1
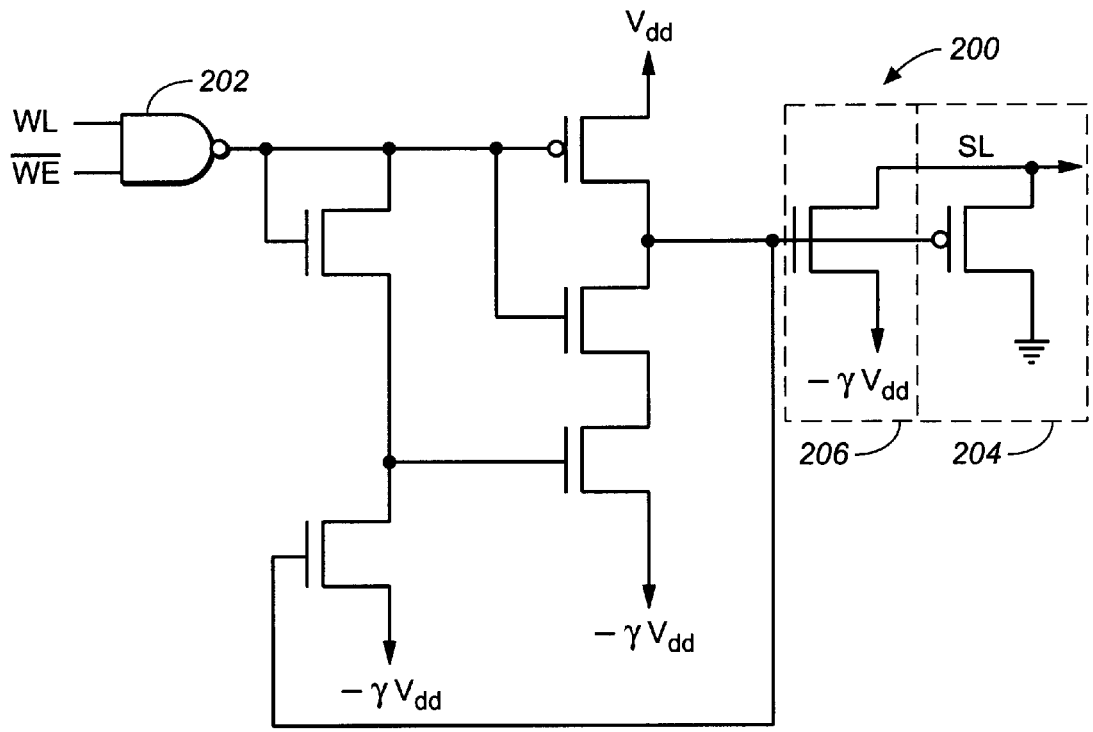
FIG._2

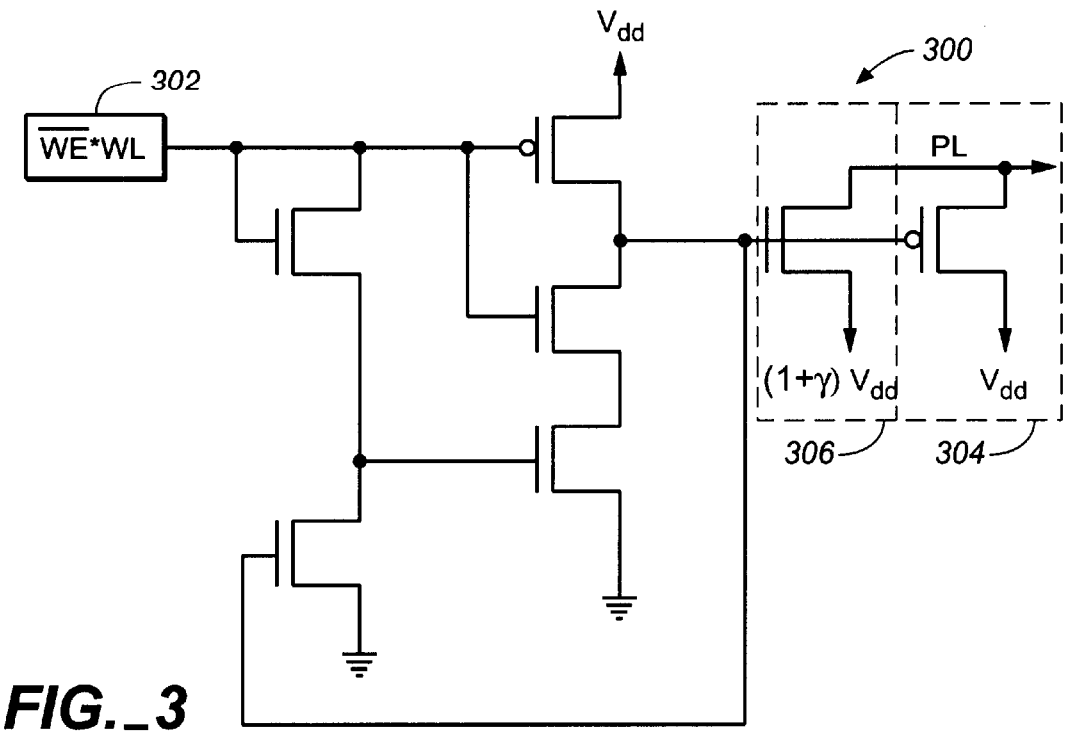
FIG._3
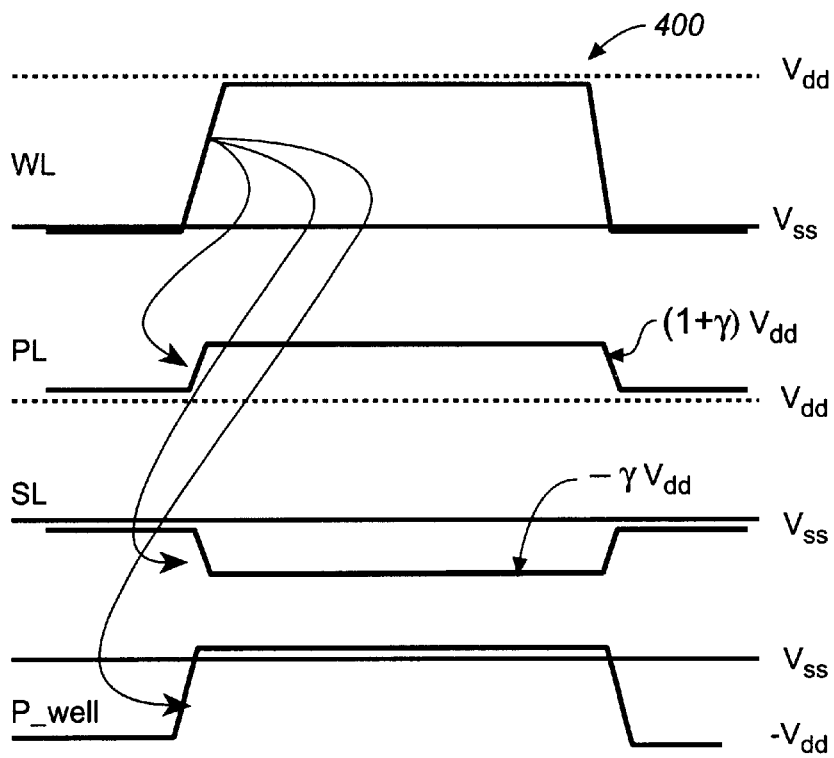
FIG._4

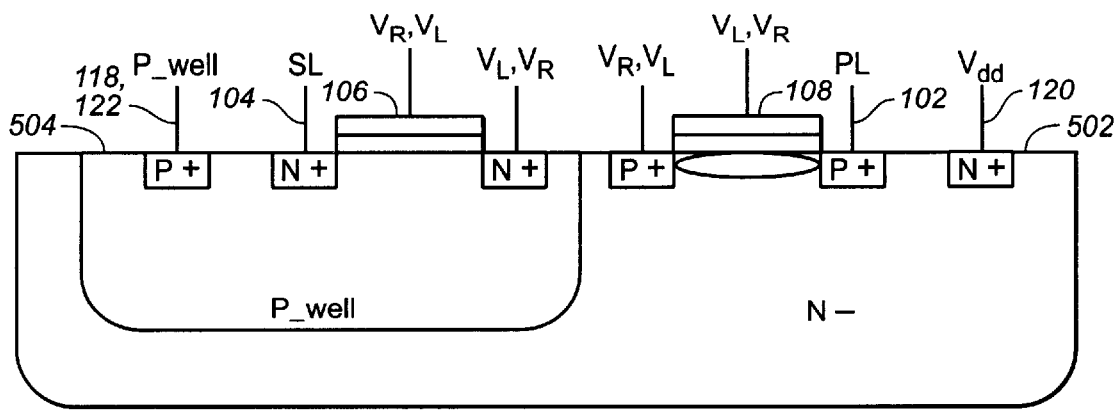
FIG._5
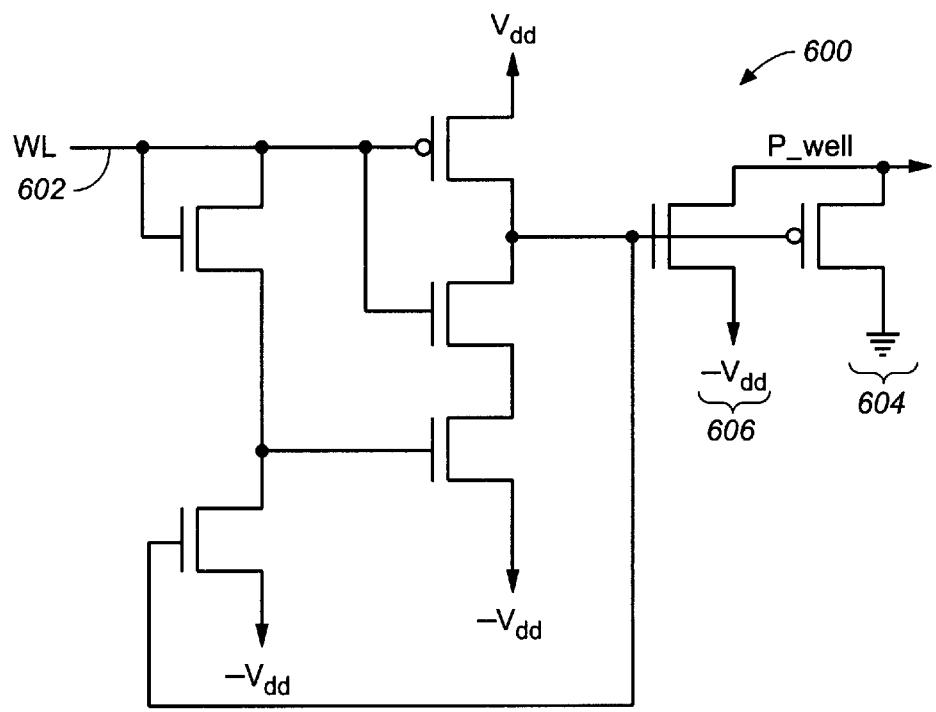
FIG._6

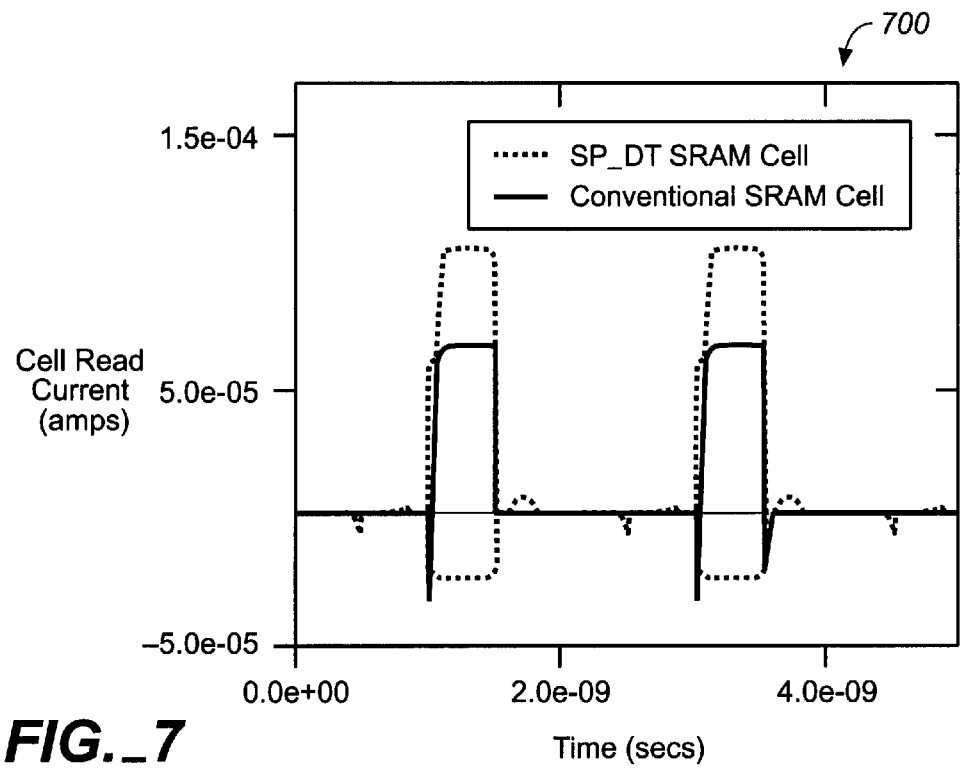
FIG._7
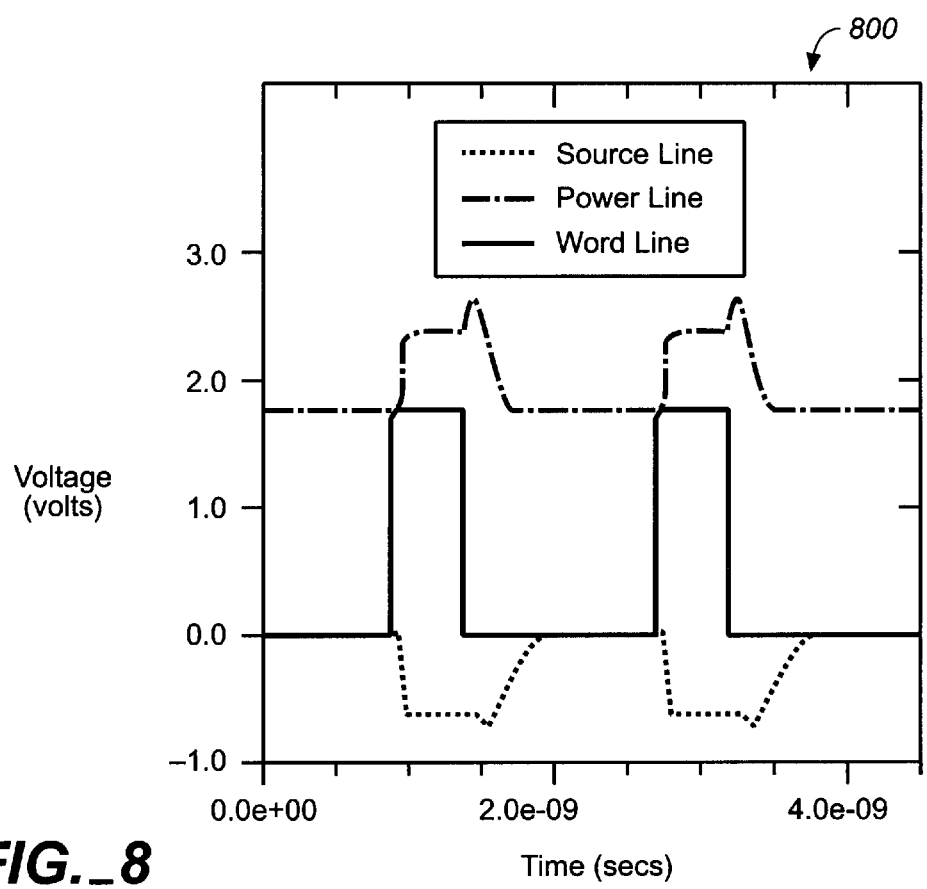
FIG._8

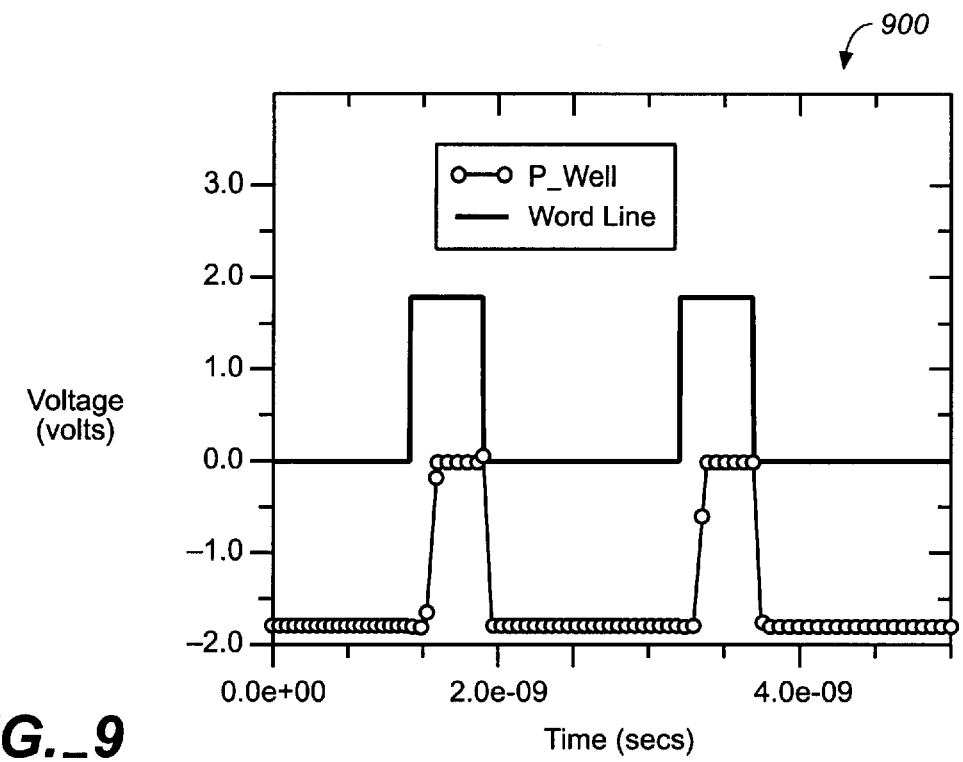
FIG._9
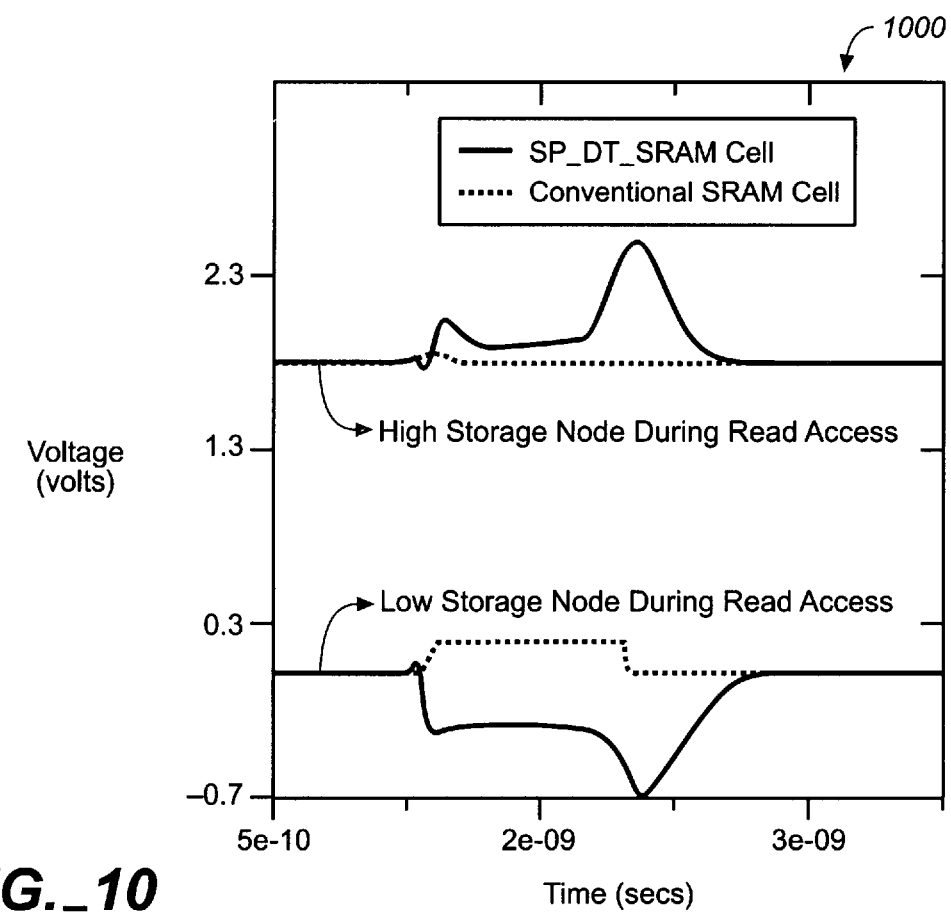
FIG._10

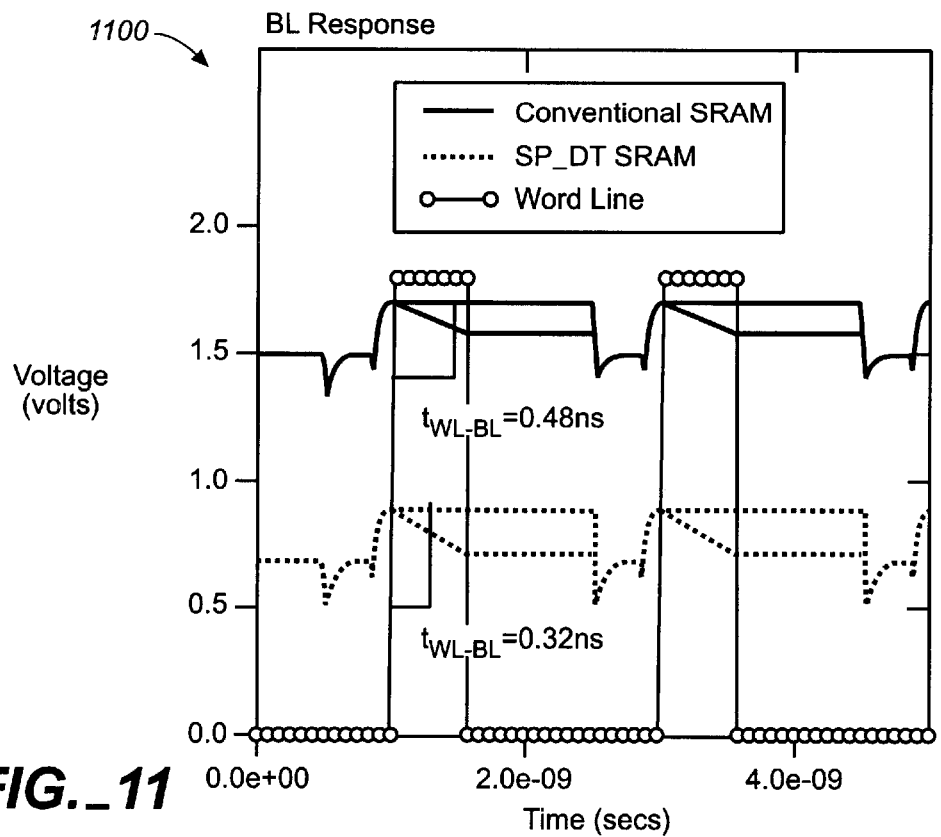
FIG._11
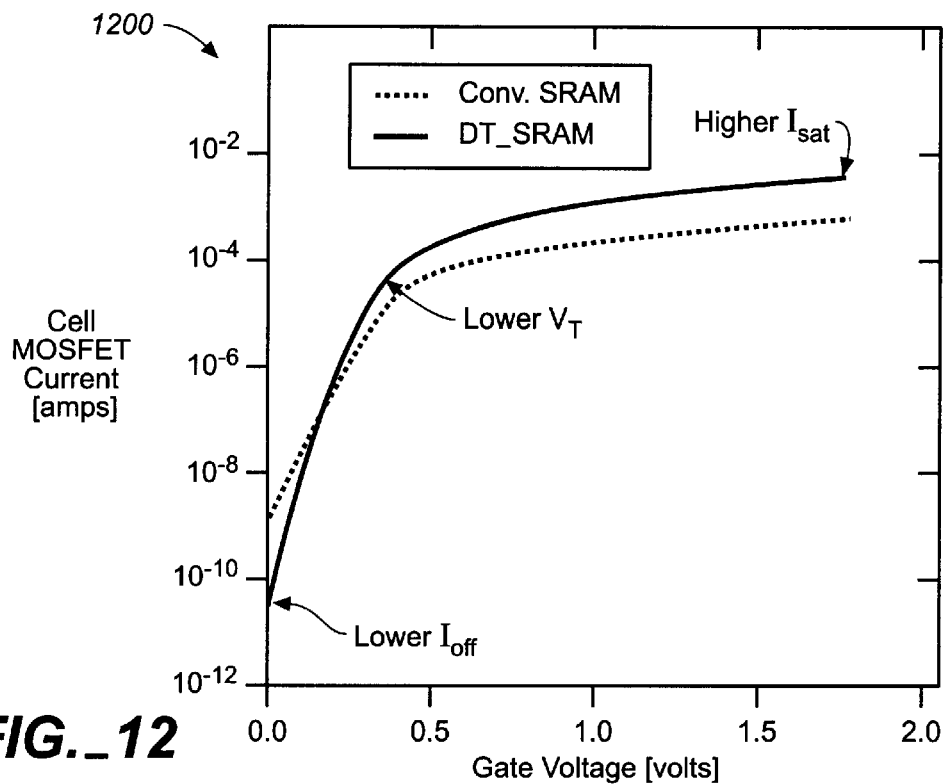
FIG._12

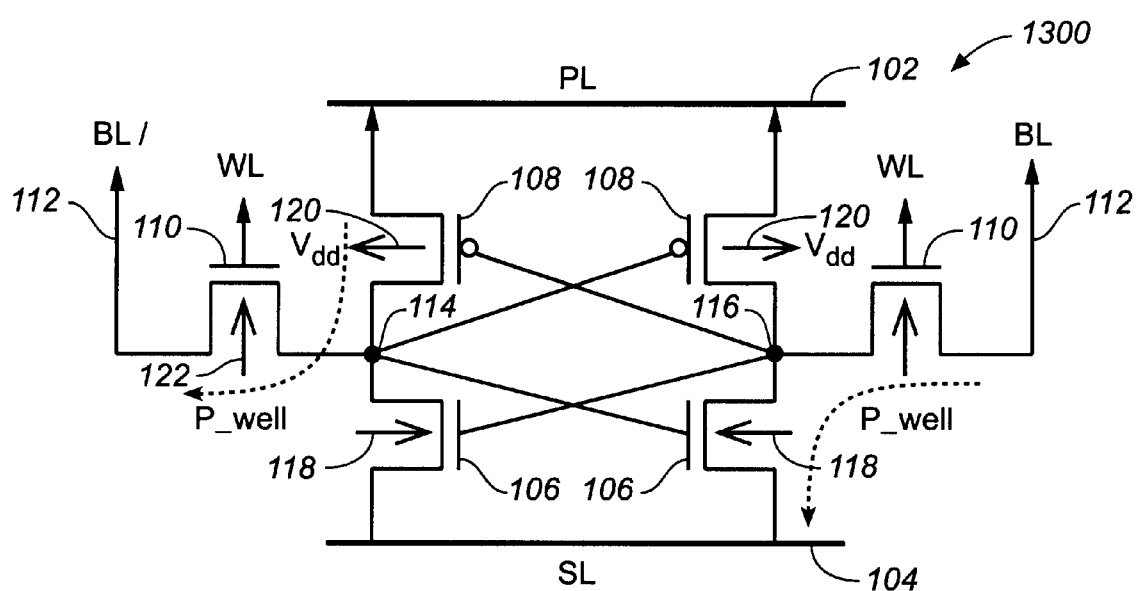
FIG._13

SOURCE PULSED, DYNAMIC THRESHOLD COMPLEMENTARY METAL OXIDE SEMICONDUCTOR STATIC RAM CELLS

BACKGROUND OF THE INVENTION

The present invention relates generally to random access memory (RAM) circuits. More specifically, but without limitation thereto, the present invention relates to a complementary metal-oxide semiconductor (CMOS) static random access memory (SRAM) cell in which the SRAM cell transistor threshold voltages are dynamically driven to increase cell speed, reduce cell leakage, and improve cell stability.

In conventional CMOS SRAM cells, the substrate terminal is connected to the source terminal of the MOSFET. The source terminal of a P-channel MOSFET is connected to Vdd, and the source terminal of an N-channel MOSFET is connected to Vss, typically ground (Gnd).

Pull-down and access transistors are typically sized to ensure adequate cell speed and noise margin. Increasing the size of the pull-down transistors lowers their on-resistance, so that the '0' storage node rises by a smaller voltage during read access. The smaller the voltage rise, the higher the noise margin. Similarly, increasing the size of the cell access transistors lowers their on-resistance, so that more current flows from the precharged bit lines through the access transistors and the pull-down transistors. Higher bit line current results in a higher read current and a correspondingly faster cell speed. The MOSFET gate threshold voltage typically must be scaled for each new technology as supply voltages are reduced to maintain the difference between the supply voltage and the gate threshold voltage. The larger the difference between the supply voltage and the gate threshold voltage, the greater the MOSFET current drive and cell speed.

With each new technology generation, the dimensions of source-drain junction depth, lower-level interconnect geometry, gate oxide thickness, and channel length of metal-oxide semiconductor field-effect transistors (MOSFET) are scaled down to increase the density, functionality, and performance of CMOS circuits. Microscopic variations in the number and location of dopant atoms in the channel region induce electrical deviations in device threshold voltage. These intrinsic fluctuations in device threshold voltage at the atomic level are most pronounced in minimum geometry transistors commonly used in area constrained circuits such as SRAM cells. In minimum geometry transistors, the transistor channel width equals the transistor channel length. Narrow width effects, soft error rate, low voltage operation, temperature and process variations, and source-drain junction parasitic resistance all contribute to increasing the instability, i.e., decreasing the static noise margin (SNH), of a conventional six-transistor (6T) SRAM cell. With projected increases in percentage of chip transistors devoted to SRAM cache memory in high performance microprocessors and application-specific integrated circuits (ASICs), sub-threshold leakage currents from an overwhelming number of inactive cells are projected to become larger than the currents from a much smaller number of active circuits switching during a memory access, placing limits on the scaling of threshold voltage of cell transistors. As the number of memory cells increases, the leakage currents become much higher than the switching currents during a memory access. This problem becomes more severe when the gate threshold voltage is scaled down with the supply voltage, because the sub-threshold leakage current increases exponentially. The increase in sub-threshold leakage current with low threshold voltage limits the extent to which MOSFET voltages may be scaled.

The bit line (BL) delay, or cell delay, is determined primarily by bit line capacitance, cell read current, and sensitivity of sense amplifiers. The bit line delay limits SRAM performance because bit line capacitance and sense amplifier sensitivity do not scale proportionally with transistor dimensions. Raising the threshold voltage of cell transistors reduces standby power dissipation from the cell array but imposes a severe penalty on bit line delay by reducing the maximum MOSFET saturation current, thus compromising cell read current and speed of minimum geometry cell transistors.

Several SRAM cell architectures have been proposed to alleviate one or more of the above limitations facing SRAM cell scaling. In these SRAM cell architectures, however, the improvements in cell drive obtainable by driving the word line voltage higher than Vdd, or boosted word line voltage, are offset by the high gate threshold voltage of the cell transistors and corresponding increased bit line delay.

SUMMARY OF THE INVENTION

The present invention advantageously addresses the problems above as well as other problems by providing a source pulsed, dynamic threshold complementary metal oxide semiconductor static random access memory that dynamically controls cell transistor threshold voltage to increase cell stability, decrease cell standby power, and reduce cell delay.

In one embodiment, the present invention may be characterized as a memory cell that includes a low storage node and a high storage node wherein the low storage node is driven below Vss during a read access and the high storage node is driven above Vdd during the read access.

In another embodiment, the present invention may be characterized as a memory cell that includes a plurality of N-channel field effect transistors (NFETs) isolated in a P-well and driven by a common word line.

In still another embodiment, the present invention may be characterized as a memory cell that includes a pull-up device that includes a power line terminal for connecting to a pulsed power line driver, a gate terminal connected to a first storage node, and an output terminal connected to a second storage node; and a pull-down device that includes a source line terminal for connecting to a pulsed source line driver, a gate terminal connected to the first storage node, and an output terminal connected to the second storage node.

BRIEF DESCRIPTION OF THE DRAWINGS

The above and other aspects, features and advantages of the present invention will be more apparent from the following more specific description thereof, presented in-conjunction with the following drawings wherein:

FIG. 1 is a schematic diagram of a source pulsed, dynamic threshold, complementary metal oxide semiconductor static random access memory cell according to an embodiment of the present invention;

FIG. 2 is a schematic diagram of a source line driver for the memory cell of FIG. 1;

FIG. 3 is a schematic diagram of a power line driver for the memory cell of FIG. 1;

FIG. 4 is a circuit timing diagram of source line voltage and power line voltage for the memory cell of FIG. 1;

FIG. 5 is a diagram of a P-well process for the memory cell of FIG. 1;

FIG. 6 is a schematic diagram of a P-well driver for the memory cell of FIG. 1;

FIG. 7 is a graph from an HSPICE simulation comparing cell read current of a conventional SRAM cell to cell read current of the memory cell of FIG. 1;

FIG. 8 is a graph from an HSPICE simulation of the source line and power line voltage waveforms for the memory cell of FIG. 1;

FIG. 9 is a graph from an HSPICE simulation of voltage waveforms of the PFET substrate terminals and the NFET substrate terminals for the memory cell of FIG. 1;

FIG. 10 is a graph from an HSPICE simulation comparing cell storage node voltage of a conventional SRAM cell to cell storage node voltage of the memory cell of FIG. 1;

FIG. 11 is a graph from an HSPICE simulation comparing the bit line voltage response of a conventional SRAM cell to the bit line voltage response of the memory cell 100 of FIG. 1;

FIG. 12 is a graph from an HSPICE simulation comparing standby current with static substrate biasing to standby current with dynamic substrate reverse biasing in identical memory cell geometries; and FIG. 13 is a schematic diagram illustrating precharging the bit line for the memory cell of FIG. 1.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

FIG. 1 is a diagram of a source pulsed, dynamic threshold, complementary metal-oxide semiconductor static random access memory (SPDT CMOS SRAM) cell 100. Shown are a power line 102, a source line 104, pull-down devices 106, pull-up devices 108, cell access devices 110, bit lines 112, storage nodes 114 and 116, pull-down NFET P-well terminals 118, pull-up PFET substrate terminals 120, and cell access NFET P-well terminals 122.

In this example, each of the pull-down devices 106 is an N-channel field-effect transistor (NFET) having an NFET substrate shorted to a P-well terminal 118. Each of the pull-up devices 108 is an inverter P-channel field-effect transistor (PFET) having a PFET substrate terminal 120. The cell access devices 110 are NFETs having NFET substrates shorted to P-well terminals 122.

All of the N-channel devices in cells accessed by a common word line are isolated from the P-channel devices by a P-well. The P-well is connected to Vss, typically Gnd, and is shorted to the P-well terminals 118 and 122 of all cells driven by a common word line.

The source of each of the PFET pull-up devices 108 is connected to the power line 102. In a conventional SRAM, the power line 102 is simply connected to a positive power supply voltage Vdd. In contrast to the conventional SRAM, the memory cell 100 pulses the power line 102 during a read access.

Likewise, the source of each of the NFET pulldown devices 106 is connected to the source line 104. In a conventional SRAM, the source line 104 is simply a negative power supply voltage Vss or ground. In contrast to the conventional SRAM, the memory cell 100 pulses the source line 104. The pulsing of the power line 102 and the source line 104 will be explained in greater detail below.

The drain of each of the pull-up devices 108 is shorted to the drain of one of the pull-down devices 106 to form a storage node driver. The common drain connections form the storage nodes 114 and 116, respectively. Each of the storage nodes 114 and 116 is connected to the two gates of the opposite storage node driver. The storage nodes 114 and 116 are also each connected in series with the bit line 112 by the cell access devices 110, respectively.

The ratio of the channel widths of the NFETs used for the pull-down devices 106 and the cell access transistors 110 is called the cell ratio or the beta ratio. The cell ratio determines how high the '0', i.e., low, storage node rises during a read access. Smaller cell ratios result in a greater voltage drop across the pull-down devices 106, allowing a smaller noise voltage at the '0' storage node to upset the data stored in the cell. Smaller cell ratios thus result in a lower noise margin.

In operation, driving the source terminals of the pull-down devices 106 below Vss and the pull-up devices 108 above Vdd by a marginal voltage difference γVdd results in a substantial increase in cell read current due to the advantageous combination of the following factors: (1) an increase in gate-source voltage, (2) an increase in drain-source voltage, and (3) a reduction in the device threshold voltage due to forward bias on the source-substrate p-n junction.

The series-connected cell access devices 110 also drive more current, because the storage nodes 114 and 116 are driven respectively below Vss and above Vdd, thus boosting the gate-source, drain-source, and source-substrate voltages of the cell access devices 110.

Driving the source terminals of the pull-down devices 106 below Vss ensures enough margin for the voltage drop across the pull-down devices 106 so that the '0' storage node does not rise above ground during a read access. An alpha particle hit thus requires more noise charge to drive the '0' storage node through the larger voltage difference to upset the state of the memory cell 100. The lower storage node voltage thus results in a higher immunity to soft error rate (SER).

Pulsing the source terminals of the pull-up devices 108 above Vdd at the power line 102 during a read access ensures enough margin for voltage drop across the pull-up devices 108 when the bit line 112 pair is precharged to a low, non-zero voltage—for example, Vdd/3. Because the source line 104 and the power line 102 are pulsed in response to transitions of the word line (WL) during a read access, drivers are used to sense the word line transitions and to pulse the source line 102 below Vss and the power line 104 above Vdd during a read access.

FIG. 2 is a schematic diagram of a source line driver 200 for the memory cell 100 of FIG. 1. Shown are an input gate 202, a Vss output section 204, and a Vss–γVdd output section 206. In this example, Vss is ground. The input gate 202 gates a word line (WL) input pulse during a read access, i.e., when write enable (WE) is false. Except during a read access, the Vss output section 204 drives the source line 104 of the memory cell 100 at a voltage substantially equal to Vss. During a read access, the gated word line input pulse switches off the Vss output section 204 and switches on the Vss–γVdd output section 206 that drives the source line 104 of the memory cell 100 below Vss by a voltage γVdd. The voltage γVdd should be less than the intrinsic potential of a p-n junction to avoid forward bias leakage.

FIG. 3 is a schematic diagram of a power line driver 300 for the memory cell 100 of FIG. 1. Shown are an input gate 302, a Vdd output section 304, and a (1+γ)Vdd output section 306. The input gate 302 gates a word line (WL) pulse during a read access, i.e., when write enable (WE) is false. Except during a read access, the Vdd output section 304 drives the power line 102 of the memory cell 100 at a voltage preferably equal to Vdd. During a read access, the gated word line pulse switches off the Vdd output section 304 and switches on the (1+γ)Vdd output section 306 that drives the power line 102 of the memory cell 100 above Vdd by the voltage γVdd.

FIG. 4 is a circuit timing diagram 400 of source line voltage and power line voltage during a read access for the memory cell 100 of FIG. 1. Shown are the word line (WL)voltage, the power line 102 (PL) voltage, the source line 104 (SL) voltage, and the P-well voltage driving the substrates of the pull-down NFETs and the cell access NFETs. Except during a read access, the power line 102 is driven by a voltage substantially equal to Vdd, the source line 104 is driven by a voltage substantially equal to Vss, and the P-well terminals 118 and 122 are driven by a voltage substantially equal to −Vdd. During a read access, however, the power line 102 is driven by a voltage substantially equal to (1+γ)Vdd, the source line 104 is driven by a voltage substantially equal to Vss-γVdd, and the P-well terminals 118 and 122 are driven by a voltage substantially equal to Vss.

FIG. 5 is a diagram of a P-well process 500 for the memory cell 100 of FIG. 1. Shown in FIG. 5 are a power line 102, a source line 104, a pull-down NFET 106, a pull-up PFET 108, a P-well terminal 118, a N-substrate terminal 120, an N-type wafer 502, and a P-well 504. The P-well 504 is formed in the N-type wafer 502 according to well known techniques for P-well processing used to provide soft error rate immunity in conventional dynamic random access memory (DRAM) cells.

FIG. 6 is a schematic diagram of a P-well driver 600 for the memory cell 100 of FIG. 1. Shown are an input 602, a Vss input section 604, and a Vns input section 606. The input 602 inputs the word line (WL) pulse that is asserted during a memory access. In standby mode, the Vns input section 606 drives the P-well terminals 118 and 122 of the memory cell 100 at a voltage substantially equal to −Vdd. During a memory access, however, the input 602 switches off the Vns input section 606 and switches on the Vss input section 604 that drives the P-well terminals 118 and 122 of the memory cell 100 at Vss. The voltage Vns in this example is preferably equal to −Vdd and the voltage Vss is preferably Gnd, however other values for Vns and Vss may be used to suit specific applications in other embodiments.

The transistors used for the P-well driver 600 may require additional processing to make the gate lengths and the gate oxides slightly larger than those typically used in ordinary cell transistors to accommodate the increased source-drain voltages. The P-well driver 600 is loaded by junction capacitance of the P-well terminals 118 of the pull-down transistors 106 and the P-well terminals 122 of the cell access transistors 110, which is less than the two-gate input capacitance seen by the word line driver.

FIG. 7 is a graph 700 from an HSPICE simulation comparing cell read current of a conventional SRAM cell to cell read current of the memory cell 100 of FIG. 1. The sum of the bit line charge and discharge currents, i.e., the effective read current, for the memory cell 100 is double that observed for a conventional SRAM cell with identical cell transistor geometries. The small dip in the read current is an artifact of the HSPICE simulation and is not a characteristic of the memory cell 100.

FIG. 8 is a graph 800 from an HSPICE simulation of voltage waveforms for the source line 104 and the power line 102 for the memory cell 100 of FIG. 1. Except during a read access, the voltage of the source line 104 is Vss, and the voltage of the power line 102 is Vdd. During a read access, however, the voltage of the source line 104 is Vss−γVdd, and the voltage of the power line 102 is (1+γ)Vdd.

FIG. 9 is a graph 900 from an HSPICE simulation of voltage waveforms of the word line (WL) and the NFET substrate terminals for the memory cell 100 of FIG. 1. Except during a memory access, the voltage of the P-well terminals 118 and 122 is −Vdd. During a memory access, however, the voltage of the P-well terminals 118 and 122 is Vss.

FIG. 10 is a graph 1000 from an HSPICE simulation comparing storage node voltages of a conventional SRAM cell to storage node voltages of the memory cell 100 of FIG. 1. Except during a read access, both the conventional SRAM cell and the memory cell 100 drive the low storage node at Vss and the high storage node at Vdd. During a read access, however, the memory cell 100 drives the low storage node below Vss, advantageously increasing the noise margin. In contrast, the conventional SRAM cell drives the low storage node above Vss, disadvantageously decreasing the noise margin. The memory cell 100 drives the high storage node of the memory cell 100 above Vdd, advantageously increasing the cell read current. In contrast, the conventional SRAM cell drives the high storage node to only Vdd.

FIG. 11 is a graph 1100 from an HSPICE simulation comparing the bit line voltage response of a conventional 6T SRAM cell to the bit line voltage response of the memory cell 100 of FIG. 1. In this example, the delay between the start of the word line pulse and the bit line voltage response of the conventional 6T SRAM cell is 0.48 ns for a bit line voltage drop of 100 millivolts, while the delay between the start of the word line pulse 1106 and the bit line voltage response of the memory cell 100 is only 0.32 ns. The memory cell 100 has the advantage in bit line voltage response time of 33 percent.

Because the source line 104, the power line 102, and the substrate terminals of the memory cell 100 are driven by the respective drivers after the arrival of the word line signal, there are additional delays introduced that reduce the gains obtained by doubling the cell read current. However, the bit line response still shows an improvement in word line/bit line delay of 33 percent for the memory cell 100 over a conventional SRAM cell with identical cell transistor geometries. Additional dynamic, i.e., switching, power is dissipated in driving the source line 104, the power line 102, and the N-substrate lines. Some of this power overhead is mitigated by the energy efficient, lower bit line precharge voltage, and the power overhead may be kept at a minimum by the commonly used hierarchically divided word line architecture with short word lines.

FIG. 12 is a graph 1200 from an HSPICE simulation comparing conventional static biasing of cell transistor substrates to the dynamically reverse-biased cell transistor substrates in identical memory cell geometries. As shown in the graph 1200, the dynamic reverse-biasing of the cell transistor substrates results in higher cell transistor saturation current, lower threshold voltage, and a reduction in standby or leakage current by more than an order of magnitude.

FIG. 13 is a schematic diagram 1300 illustrating charging and discharging the bit line pair for the memory cell 100 of FIG. 1 during a read access. Shown in FIG. 13 are a power line 102, a source line 104, pull-down devices 106, pull-up devices 108, cell access devices 110, bit lines 112, storage nodes 114 and 116, pull-down NFET P-well terminals 118, pull-up PFET substrate terminals 120, and cell access NFET P-well terminals 122.

In a conventional CMOS RAM cell, the '1', i.e., the high, storage node voltage deteriorates rapidly with lower bit line voltages due to the higher channel resistance of the pull-up PFETs compared to that of the pull-down NFETs, making it necessary in conventional CMOS SRAM cells to precharge bit lines 112 to Vdd. However, high bit line precharge voltages preclude potential opportunities to improve bit line delay. By precharging the bit lines 112 to a lower voltage, Vdd/3 in this example, one of the bit lines 112 may be driven higher than the precharge voltage and the other of the bit lines 112 may be driven lower than the precharge voltage during a read access. Also, a bit line precharge voltage of Vdd requires higher power than a lower precharge voltage to recover the bit line voltage back to Vdd after a write operation or after extended periods of cell inactivity when a clocked (AC) bit line is used. Clocked bit line loads are typically used in high performance SRAMS so that the minimum geometry cell pull-down transistors do not have to overcome direct current (DC) bit line loads when pulling the bit lines down during a read access.

In the arrangement of FIG. 13, the bit lines 112 are precharged to a voltage lower than Vdd, Vdd/3 in this example. This allows one of the bit lines 112 to be driven above the precharge voltage by one of the pull-up devices 108 and the opposite bit line 112 to be driven low by one of the pull-down devices 106.

Because the source pulsed, dynamic threshold memory cell 100 does not require Vdd and Vss rails, the overhead in cell area originates from additional area consumed by separate source and substrate terminals. However, this overhead in cell area may be kept at a minimum by using unity cell ratios, because the source pulsed, dynamic threshold memory cell 100 is substantially more stable than a conventional SRAM cell. The 1999 International Roadmap for Semiconductors (ITRS) projects multiple supply voltage requirements for analog and RF blocks in a heterogeneous system-on-a-chip, making the availability of multiple power supplies for source pulsed, dynamic threshold CMOS SRAMS economically feasible for new designs.

The source pulsed, dynamic threshold CMOS SRAM described above improves the noise margin by more than 70 percent, word line/bit line delay by 33 percent, bit line power by more than 50 percent, and sub-threshold leakage current by more than an order of magnitude. These improvements are achieved by pulsing the source and the substrate terminals of the cell transistors selectively outside the Vss range.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A memory cell comprising:
   a pull-up device comprising a power line terminal for connecting to a pulsed power line driver, a gate terminal connected to a first storage node, and an output terminal connected to a second storage node; and
   a pull-down device comprising a source line terminal for connecting to a pulsed source line driver, a gate terminal connected to the first storage node, and an output terminal connected to the second storage node wherein the pull-up device further comprises a substrate terminal for connecting to (Vdd) and wherein the pull-down device is formed in a P-well comprising a P-well terminal for connecting to a P-well driver.

2. The memory cell of claim 1 further comprising a cell access device formed in the P-well and connected in series with a bit line and the second storage node.

3. The memory cell of claim 2 wherein the pull-down device and the cell access device are electrically isolated in the P-well and are driven by a common word line.

4. The memory cell of claim 2 wherein the bit line is precharged to a precharge voltage less than (Vdd).

5. The memory cell of claim 4 wherein the bit line is precharged to (Vdd)/3.

6. The memory cell of claim 4 wherein the pull-up device drives the bit line above the precharge voltage.

7. The memory cell of claim 4 wherein the pull-up device drives the bit line below the precharge voltage.

8. The memory cell of claim 1 further comprising the P-well driver.

9. The memory cell of claim 8 wherein the P-well driver generates a voltage lower than (Vss) except during a read access and a voltage substantially equal to (Vss) during the read access.

10. The memory cell of claim 9 wherein the P-well driver generates a voltage substantially equal to −(Vdd) during the read access.

11. A memory cell comprising:
    a pulsed power line driver;
    a pull-up device comprising a power line terminal for connecting to the pulsed power line driver, a gate terminal connected to a first storage node, and an output terminal connected to a second storage node;
    a pull-down device comprising a source line terminal for connecting to a pulsed source line driver, a gate terminal connected to the first storage node, and an output terminal connected to the second storage node wherein the pulsed power line driver generates a voltage substantially equal to (Vdd) except during a read access and a voltage of $(1+\gamma)(Vdd)$ during the read access wherein $\gamma(Vdd)$ exceeds Vdd by not more than an intrinsic potential of a source-substrate p-n junction.

12. A memory cell comprising:
    a pulsed source line driver;
    a pull-up device comprising a power line terminal for connecting to a pulsed power line driver, a gate terminal connected to a first storage node, and an output terminal connected to a second storage node; and
    a pull-down device comprising a source line terminal for connecting to the pulsed source line driver, a gate terminal connected to the first storage node, and an output terminal connected to the second storage node wherein the pulsed source line driver generates a voltage substantially equal to (Vss) except during a read access and a voltage of $(Vss)-\gamma(Vdd)$ during the read access wherein $\gamma(Vdd)$ exceeds (Vdd) by not more than an intrinsic potential of a source-substrate p-n junction.

* * * * *